United States Patent [19]

Black

[11] Patent Number: 4,804,923

[45] Date of Patent: Feb. 14, 1989

[54] VOLTAGE CONTROL SYSTEM

[75] Inventor: George F. Black, Coventry, England

[73] Assignee: Lucas Industries, Birmingham, England

[21] Appl. No.: 51,724

[22] Filed: May 18, 1987

[30] Foreign Application Priority Data

Jun. 6, 1986 [GB] United Kingdom ................ 8613737

[51] Int. Cl.[4] ........................ H03K 5/04; H03K 5/153; H02M 1/08

[52] U.S. Cl. ........................................ 328/26; 328/61; 328/58; 307/261; 307/264; 307/265; 363/89

[58] Field of Search ........................ 328/65, 26, 28, 61, 328/58; 323/235; 307/647, 633, 354, 643, 261, 290, 271, 264; 363/89, 84, 85, 86

[56] References Cited

U.S. PATENT DOCUMENTS 3,798,531 3/1974 Allington .............................. 363/89
3,979,661 9/1976 Matz .................................... 307/647
4,480,200 10/1984 Tan et al. ............................ 307/290

*Primary Examiner*—John S. Heyman
*Attorney, Agent, or Firm*—Trexler, Bushnell, Giangiorgi & Blackstone, Ltd.

[57] ABSTRACT

A system for deriving a substantially constant output voltage from an alternating supply voltage of variable frequency and amplitude includes circuit responsive to negative-going zero crossing points of the supply for generating control signals whose duration depends on the number of points occurring in a predetermined time. A switching arrangement is responsive to the signals to interrupt the supply voltage, the interrupted voltage being applied through a transformer to an output circuit from which a d.c. output voltage is applied to spark igniters.

7 Claims, 6 Drawing Sheets

VOLTAGE CONTROL SYSTEM

This invention relates to a control system for deriving a substantially constant voltage from an alternating supply of variable frequency and amplitude. In particular the invention relates to a system for supplying a substantially constant voltage to a spark igniter arrangement for a gas turbine engine, where this voltage is to be derived from an alternator which is driven by the engine. In such an arrangement the output of the engine-driven alternator will vary considerably in frequency and amplitude. If the arrangement is to provide an adequate spark discharge at low voltage, such as when the engine is started, the spark discharge at higher engine speeds may damage the igniter.

It is an object of the invention to provide a system in which the above problems are overcome.

According to the invention there is provided a system for deriving a substantially constant output voltage from an alternating supply of variable frequency and amplitude, comprising a circuit responsive to a detectable point in each cycle of the supply for generating a control signal whose duration depends on the number of said detectable points which occur in a predetermined time, means responsive to said control signal for interrupting said alternating supply, and an output circuit for deriving said output voltage from the interrupted supply.

An embodiment of the invention will now be described by way of example only and with reference to the accompanying drawings in which:

FIG. 1 is a block diagram of a spark discharge arrangement incorporating a voltage control system according to the invention, FIG. 2 shows a control signal generating circuit forming part of FIG. 1, FIG. 3 shows a switching circuit forming part of FIG. 1, FIG. 4 shows a spark voltage output circuit forming part of FIG. 1, and FIGS. 5–8 show wave forms generated at a plurality of frequencies of alternating supply.

As shown in FIG. 1 a generator 10 which is driven by a gas turbine engine (not shown) supplies an alternating voltage on lines 11 to a spark voltage output circuit 13 by way of a switching circuit 14 and a transformer 15. The circuit 13 supplies a voltage pulse to each of two spark igniters 16. The switching circuit 14 is responsive to control signals T on pairs of lines 17, 18 and 19, 20 from respective identical control signal generating circuits 21, 22. The circuits 21, 22 are responsive to signals on a line 23 from one of the lines 11 and also to a signal on a line 24 indicative of a requirement to energise the igniters 16, the signals on line 24 being derived from a +5v supply in a manner to be described.

As shown in FIG. 2 the circuit 21 includes a Schmidtt trigger circuit 30 and a zener diode 31 to both of which the signal on line 23 is applied by way of a resistor 32 and an amplifier circuit 29. The threshold of the trigger circuit 30 is close to 0v so that a positive pulse is provided on a line 33 at a detectable point on each cycle of the supply on lines 11, this point being the negative-going zero crossing point of the alternator output. The amplifier circuit 29 ensures that if the supply on line 11 becomes erratic in such a manner that the magnitude of a negative-going excursion is small, that excursion will nevertheless be detected and the pulse on line 33 be provided. The pulse on line 33 is applied to a clock terminal of D type bistable 34 whose D terminal is maintained at +5v, giving an output signal QA which goes positive in response to the clock pulse on line 33. This output signal QA is applied through a timing circuit 35 and inverter 36 to the clear terminal CLR of the bistable 34, the arrangement being such that the output QA on a line 37 persists for 0.6 milliseconds in response to the clock signal CK on line 33.

The signal on line 37 is applied to the D input of a further D-type bistable 38 which is also clocked by the signal on line 33 and is enabled when the signal on line 24 is at +5v. The arrangement is such that the bistable 38 provides an output signal QB which is low only when the signal on line 24 is +5v and when a clock signal on the line 33 occurs outside one of the 0.6 msec signals on line 37. The QB signal is applied by way of a line 39 and a diode 40 to an oscillator circuit 41 which provides a 1.5 MHz output when the signal QB is low. Three parallel amplifiers 42 are responsive to signals from the oscillator 41 to provide an increased output by way of a capacitor 43 to the primary of a step-up isolating transformer 44.

The output voltage of the transformer 44 is half-wave rectified by a diode 45 to provide a d.c. voltage across lines 17, 18. A depletion-mode FET 46 is connected between the lines 17, 18. Alternate half cycles from the transformer 44 pass through a resistor 47 and a diode 48 and maintain a voltage on the gate of the FET 46 which render it non-conductive. Voltage on the gate of the FET 46 is smoothed by a capacitor 49.

As shown in FIG. 3 the circuit 14 includes two enhancement-mode FETs 50, 51 having their sources commonly connected to the line 18 and their gates connected to the line 17. Two further enhancement mode FETs 52, 53 have their sources commonly connected to the line 20 and their gates to the line 19. In the presence of the rectified signals T on lines 17, 19 the FETs 50, 51 and the FETs 52, 53 respectively are biased to permit current flow to the primary of the transformer 15 (FIG. 1). When FET 46 and the corresponding FET in circuit 22 are conductive the source-gate capacitance of the FETs in the circuit 14 is shorted out, ensuring that these devices have a rapid switch-off response when the signals T on line 17, 19 are removed. The source-gate capacitance of these FETs is effective to smooth the half-wave rectified d.c. on the lines 17, 19.

As shown in FIG. 4 the secondary winding of the transformer 15 is connected through a known form of rectifier and voltage doubling circuit 60 to an earth rail 61 and to a high voltage rail 62. A spark discharge device 63 is connected between the rails 1, 62. Capacitors 64, 65 are connected between the rail 62 and lines 66 and 67 which are in turn connected to the rail 61 through respective identical diode arrangements 68, 69, such that the lines 66, 67 are prevented from becoming negative with respect to the earth rail 61. Identical resistor chains 70, 71 of 3k ohms each are connected in parallel with the respective diode arrangements 68, 69. Lines 66, 67 communicate by way of respective chokes 72, 73 with respective ones of the spark igniters 16 (FIG. 1). In use the voltage doubling circuit 60 responds to alternating output from the transformer 15 to increase the voltage on the rail 62 to −3 kV, charging the capacitors 64, 65 correspondingly, the lines 66, 67 being at this stage close to earth potential by virtue of the low resistance of the chains 70, 71. The spark discharge device 63 breaks down at −3 kV, connecting the rail 62 to earth and bringing the potential on the lines 66, 67 to +3 kV which is discharged through respective ones of the igniters 16 (FIG. 1). Since the diode arrangements 68, 69 prevent the rails 66, 67 from going negative the spark discharge does not continue after the voltage on these rails has dropped to earth potential.

Referring back to FIG. 1 identical isolating circuits 80, 81 are responsive to respective identical control signals C1, C2 from a controlling computer (not shown). The circuit 80 includes a light-emitting diode 82 energised from a +5v source only when the signal C1 is low, in which circumstance a photo transistor 83 is switched on and connects the line 24 to earth, maintaining the output QB of the bistable 38 permanently high, whereby the FETs in circuit 14 permanently interrupt current flow. When the signal C1 is high the transistor 83 is off and the signal on line 24 is +5v, enabling the bistable 34 to respond to clock signals on the line 33. Since the line 24 from circuit 80 is connected to the corresponding line from circuit 81, it will be apparent that both signals C1, C2 must be high to permit the igniters 16 to operate.

FIG. 5 shows the signals QA, QB from the bistables 34, 38 respectively when the frequency of the alternating supply S is less than 1667 Hz, that is when the time for one alternating cycle exceeds the 0.6 msec output of the signal QA. As described with respect to FIG. 2 the negative-going cross over of the alternating supply S provides a clock signal CK to bistables 34, 38. The output QA goes high for 0.6 msec, and because of propagation delay, indicated at d, in bistable 34 the D input of bistable 38 is not high during the initial clock signal CK. The output QB thus remains low. The same condition obtains at the subsequent clock signals CK so that QB remains low. The oscillator 41 is permanently energised and maintains a signal T on line 17 to keep the FETs 50, 51 switched on, so that alternating supply to the transformer 15 is not interrupted. The foregoing also applies to the circuit 22 and the FETs 52, 53.

FIG. 6 shows signals QA, QB when the interval between clock signals CK is just less than 0.6 msec, that is with a supply frequency just over 1667 Hz. Initially QA goes high and QB stays low, as before. At the next succeeding clock signal CK QA is high and QB is thereby set high, and remains high until a clock signal occurs when QA is low. The effect is that when only one clock signal occurs during the time when QA is high the signal QB is high for one cycle of the supply S, which is therefore interrupted for that time.

Figure 1:
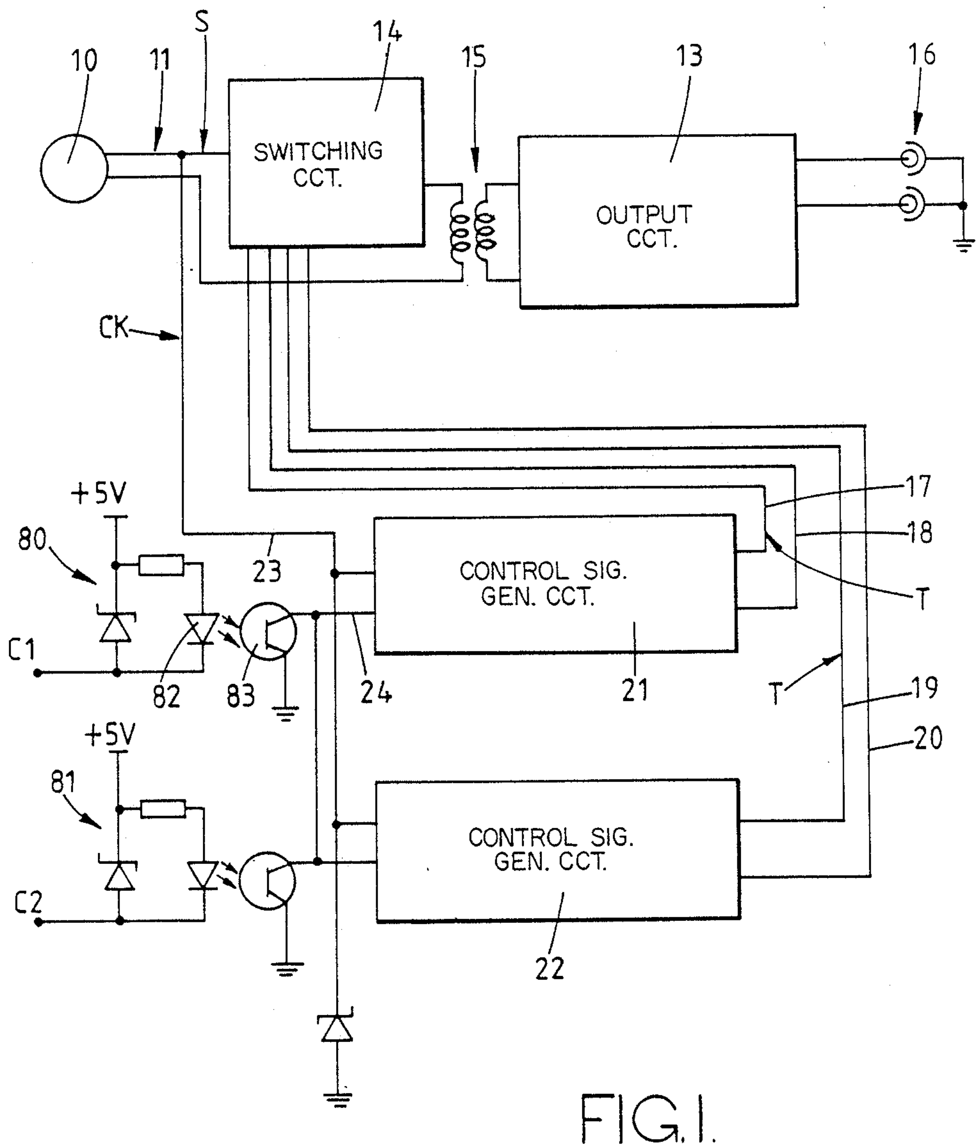
Figure 2:
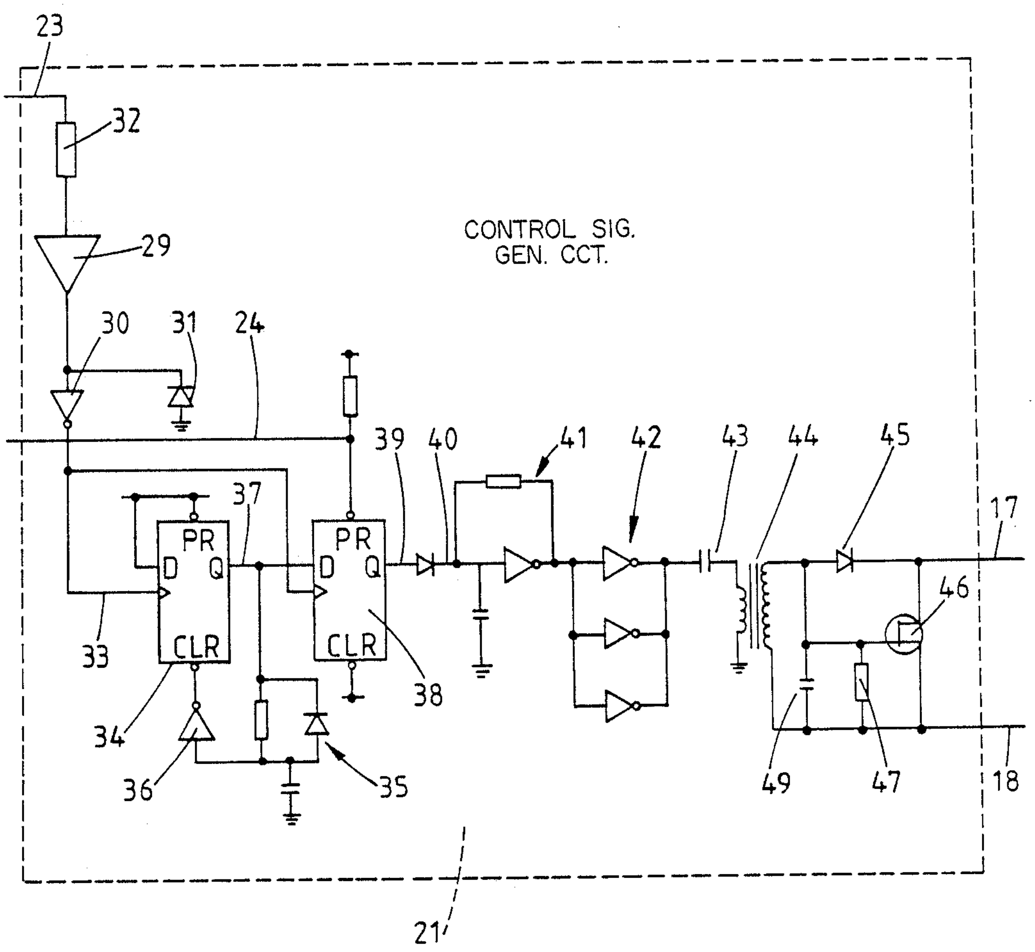
Figure 3:
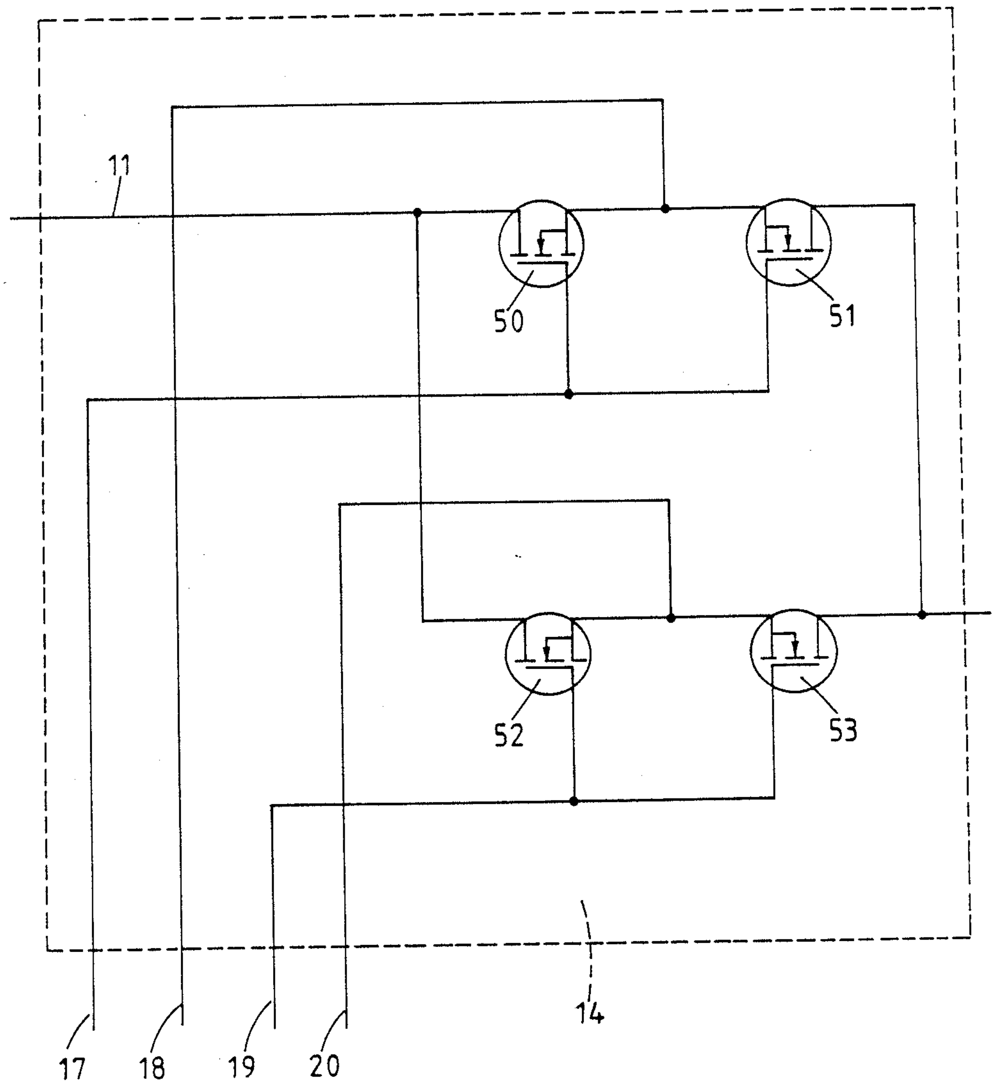
Figure 4:
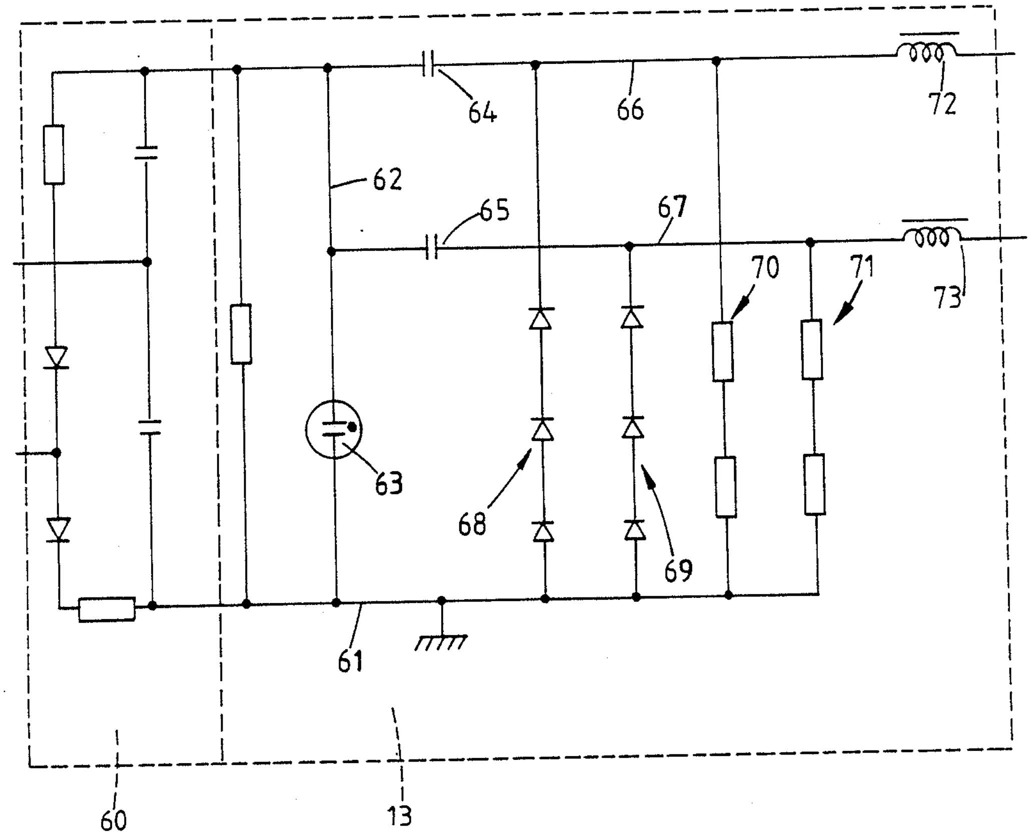
Figure 5:
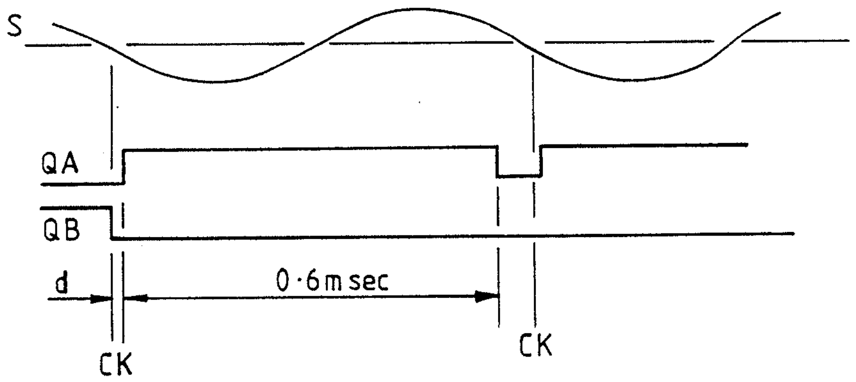
Figure 6:
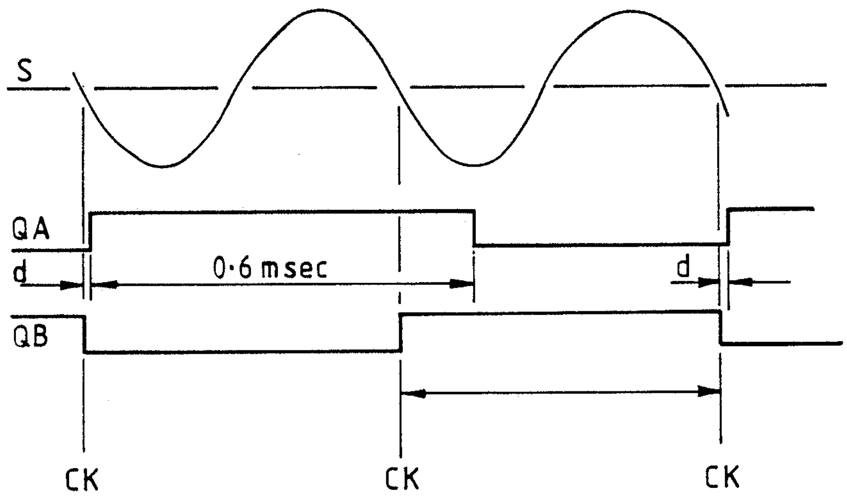
Figure 7:
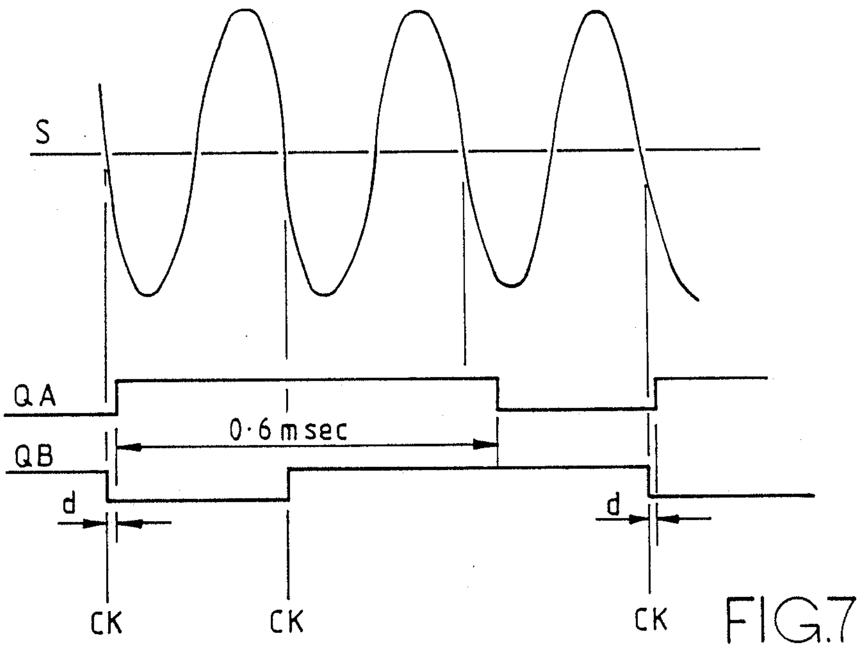
FIG. 7 shows signals QA, QB when two clock signals occur in the 0.6 msec high level QA signal, that is when the frequency of supply S is greater than 3333 Hz. It will be seen that QB goes high to interrupt the alternating supply for two cycles in every three thereof.
Figure 8:
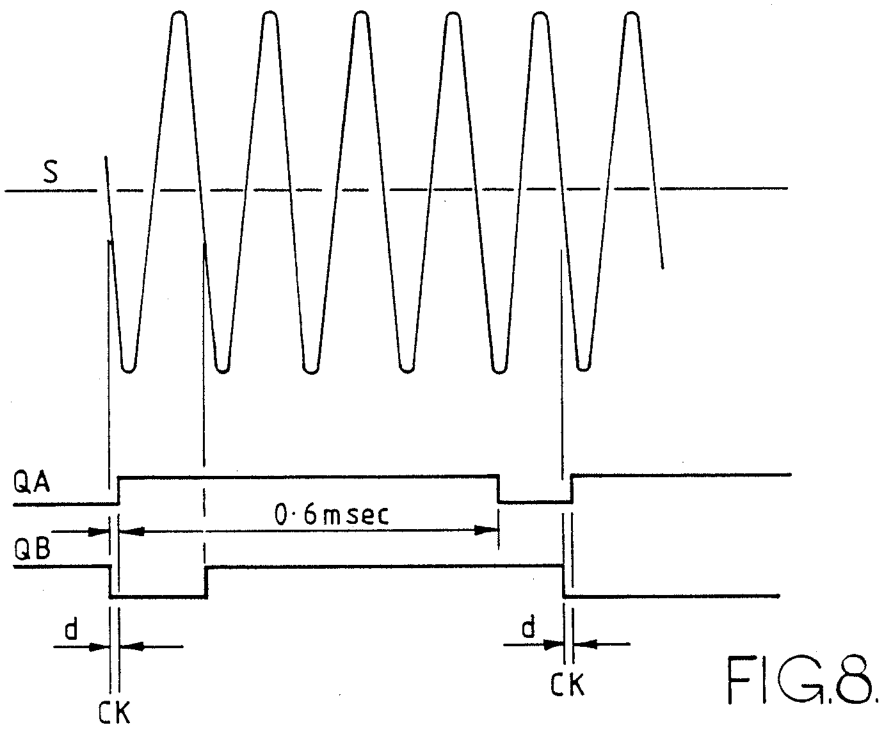
FIG. 8 shows four clock signals occurring in the 0.6 msec high level of signal QA, that is when the supply frequency is greater than 6667 Hz. The supply S interrupted for four cycles out of every five.

The arrangement thus reduces the duration of input to the transformer in a stepwise fashion with the increase in supply frequency which results from an increase in alternator speed. Since the rms voltage of the supply S also increases with alternator speed the general effect is that the product of rms voltage and duration of its application to the transformer 15 remains within relatively narrow limits at frequencies over 1667 Hz.

I claim:

1. A system for deriving a substantially constant output voltage from an alternating supply of variable frequency and amplitude, comprising a circuit responsive to a detectable point in each cycle of the supply for generating a control signal whose duration depends on the number of said detectable points which occur in a predetermined time, a switching arrangement responsive to said control signal for interrupting said supply for the duration of said control signal and an output circuit for deriving said output voltage from the switched supply.

2. A system for deriving a substantially constant output voltage from an alternating supply of variable frequency and amplitude, comprising a circuit responsive to a detectable point in each cycle of the supply for generating a control signal whose duration depends on the number of said detectable points which occur in a predetermined time, a switching arrangement responsive to said control signal for interrupting said supply for the duration of said control signal and an output circuit for deriving said output voltage from the switched supply, said circuit for generating said control signal comprising a device responsive to an initial one of said detectable points for generating a first signal of a predetermined duration and a device for initiating a second signal when a detectable point in a succeeding cycle occurs before the end of said first signal, said control signal being equal in duration to said second signal.

3. A system according to claim 2 in which said circuit for generating said control signal includes an oscillator responsive to said second signal, and a rectifier arrangement for deriving said control signal from the output of said oscillator.

4. A system according to claim 3 in which said switching arrangement comprises two field effect transistors to whose gates the control signal is applied and whose sources are commonly connected to said rectifier arrangement.

5. A system according to claim 2 which comprises a plurality of circuits for generating respective control signals and a plurality of said switching arrangements arranged in parallel and responsive to respective ones of said control signals.

6. A system according to claim 2 in which said output circuit includes a rectifier circuit for deriving a d.c. voltage from said switched supply.

7. A system according to claim 6 in which said output circuit includes means for preventing said output voltage from changing polarity.

* * * * *